United States Patent [19]
Shan et al.

[11] Patent Number: 5,605,637
[45] Date of Patent: Feb. 25, 1997

[54] ADJUSTABLE DC BIAS CONTROL IN A PLASMA REACTOR

[75] Inventors: Hongching Shan, San Jose; Evans Lee, Milpitas; Robert Wu, Pleasanton, all of Calif.

[73] Assignee: Applied Materials Inc., Santa Clara, Calif.

[21] Appl. No.: 356,825

[22] Filed: Dec. 15, 1994

[51] Int. Cl.$^6$ .................................................. H05H 1/00
[52] U.S. Cl. .......................... 216/71; 156/345; 118/723 E
[58] Field of Search ............................. 156/345, 643.1; 216/67, 71; 315/111.21; 118/723 E; 204/298.01, 298.06, 298.31, 298.34

[56] References Cited

U.S. PATENT DOCUMENTS

| | | | |
|---|---|---|---|
| 5,210,466 | 5/1993 | Collins et al. | 315/111.21 |
| 5,304,279 | 4/1994 | Coultas et al. | 156/345 |
| 5,366,585 | 11/1994 | Robertson et al. | 156/345 X |
| 5,415,728 | 5/1995 | Hasegawa et al. | 156/345 X |

FOREIGN PATENT DOCUMENTS 179421  7/1989  Japan ....................................... 156/345

*Primary Examiner*—Thi Dang
*Attorney, Agent, or Firm*—Peter J. Sgarbossa; Noel F. Heal

[57] ABSTRACT

A plasma chamber, and a related method for its use, in which the direct current (dc) bias on a wafer-supporting cathode is reduced by including a plasma shield that blocks plasma from reaching a region of the chamber and thereby reduces the effective surface area of a grounded anode electrode. The plasma shield has a number of narrow slits through it, small enough to preclude the passage of plasma through the shield, but large enough to permit pumping of process gases through the shield. The dc bias is further controllable by installing a chamber liner of dielectric or other material to cover a selected portion of the inside walls of the chamber. The liner also facilitates cleaning of the chamber walls to remove deposits resulting from plasma polymerization.

21 Claims, 1 Drawing Sheet

ADJUSTABLE DC BIAS CONTROL IN A PLASMA REACTOR

BACKGROUND OF THE INVENTION

This invention relates generally to plasma reactors used in etching and other processes and, more particularly to techniques for controlling direct current (dc) bias in such reactors. In a dry etching process typically used in the fabrication of integrated semiconductor devices, process gases are supplied to a reactor chamber and radio-frequency (rf) energy generates and sustains a plasma cloud within the chamber. Ions in the plasma cloud bombard a workpiece, which is usually a semiconductor wafer located in the chamber immediately adjacent to the plasma, or in a separate processing chamber into which ions from the plasma are drawn. The ions either etch the workpiece or assist the etching, and the etching process may be made selective by patterning a protective coating applied to the workpiece prior to etching.

In general, there are three types of plasma generation approaches: capacitive, inductive, and microwave. In the more conventional capacitive plasma approach, the plasma is formed between a pair of parallel plate electrodes, to which radio-frequency (rf) power is applied, to one or both plates. A variant of the parallel plate approach is the magnetically enhanced reactive ion etch (MERIE) plasma generation apparatus, in which a magnetic field enhances the formation of ions in the plasma. Inductive plasma generators use an inductive coil, either a planar coil, a cylindrical coil or any of various other types of coils to deliver rf power into the plasma chamber. A separate rf generator supplies energy to at least one plate electrode in the chamber, to control ion energy and direction.

A well known phenomenon in plasma reactors is the generation of a direct current (dc) bias between the plasma and a lower electrode to which rf power is applied. The dc bias accelerates positive ions in the reactor chamber toward the lower electrode, to which a semiconductor wafer is secured for processing. The energy of the ions accelerated from the plasma is one of the most important factors that determine the rate at which etching of the wafer takes place. Another important factor, of course, is the density of the plasma. The dc bias generated on the lower electrode varies, as might be expected, with the rf power applied to the electrode, and this parameter is sometimes used to control the dc bias, and thereby control the plasma energy and the etch rate. In a conventional reactive ion etch process, the lower electrode is also used to couple energy capacitively into the chamber, to generate and sustain the plasma. In this case, the rf power does not provide an independent control of plasma energy, since it also affects the density of the plasma. Typical dc bias levels in a magnetically enhanced reactive ion etch (MERIE) chamber range from −300 v to −700 v and operating pressures are 50 to 300 mTorr, at powers of 500 to 1000 watts.

A high dc bias has the principal disadvantage that the highly energetic ions it produces tend to cause unwanted damage to the wafer being etched and underlayer sputtering. Related processing problems included back-sputtering of etched material, lower selectivity of etching, and difficulties in forming reliable metal contact layers. Adding a magnetic field reduces the dc bias considerably, but not enough to provide a low damage, high selectivity, and high etch rate process. If the magnetic field is raised too high, above about 40 to 60 gauss (dependent upon the specific process used), device charge-up becomes a significant concern. Device charge-up is caused as a result of ions and electrons in the plasma drifting in opposite directions under the influence of the magnetic field, and a consequent non-uniform charge distribution in the plasma and in the wafer where accumulated charge breakdown occurs.

Inability to control the dc bias places an upper limit on the rf power applied to the reactive ion etch chamber, because this is the only way to limit damage caused by a high dc bias. Limiting the rf power necessarily limits the etch rate, so the chamber can only be used for one type of process. For example, a chamber designed to have a low dc bias can be used for low-damage processes, but a different chamber design is needed for a process needing higher power and a higher etch rate.

Clearly it would be desirable to have an etch reactor that could be operated at a selected lower dc bias, to avoid the problems caused by a high dc bias, but still be able to operate at relatively high etch rates. The present invention achieves this goal and provides additional advantages.

SUMMARY OF THE INVENTION

The present invention resides in a plasma reactor chamber that may be easily adapted to operate at lower dc bias levels and at high etch rates. Briefly, and in general terms, the apparatus of the invention includes a grounded reactor chamber having conductive walls; a grounded first electrode located in the chamber; a second electrode spaced apart from the first electrode, for supporting a workpiece to be processed in the reactor chamber; at least one inlet port for supplying process gases to the reactor chamber; at least one outlet port for evacuating gases from the chamber; a high-frequency power source connected between the second electrode and ground, to generate and sustain a plasma in the reactor chamber; and a plasma shield installed in the reactor chamber to prevent the plasma from reaching a portion of the reactor chamber. The effective area of the grounded first electrode is reduced because the plasma is prevented from contacting the full extent of the chamber walls, and the reduced effective area results in a reduced dc bias on the second electrode.

Preferably, the plasma shield is of a dielectric material and has a plurality of narrow openings through it to permit flow of process gases but not plasma. Specifically, the openings are smaller in width than the thickness of a sheath region of the plasma, and are less than approximately 0.5 millimeter in width. In the illustrative embodiment of the invention, the plasma shield takes the form of an annular ring of dielectric material sized to fit in an annular region of the reactor chamber to prevent the plasma from reaching the annular region. The plasma shield has a plurality of narrow slits through it to permit flow of process gases but not plasma.

In accordance with another important aspect of the invention, the plasma reactor further comprises a chamber liner installed over at least a portion of the interior wall of the reactor chamber, to further reduce the effective area of the first electrode and, therefore, to further reduce the dc bias on the second electrode. Preferably, the chamber liner is also of a dielectric material and extends over a selected portion of the interior wall of the reactor chamber, to effect a desired reduction in the dc bias.

In accordance with a related method of the invention, a plasma reactor is operated by performing the steps of installing a plasma shield in a plasma etch reactor chamber, the plasma shield having a plurality of slits through it to permit passage of process gases but to prevent the passage of plasma to a selected portion of the reactor chamber; supplying process gases to the chamber; supplying high frequency power between a lower electrode and a grounded upper electrode in the chamber, to generate and sustain a plasma in the chamber; and pumping used process gases from the chamber. The presence of the plasma shield reduces the effective surface area of the grounded upper electrode and thereby reduces the dc bias between the lower electrode and the plasma. In a further aspect of the invention, a chamber liner is installed on at least a portion of the inside surface of the chamber, to further reduce the effective surface area of the grounded upper electrode and thereby further reduce the dc bias between the lower electrode and the plasma. In yet another aspect of the invention, the chamber liner is removed and replaced periodically to facilitate cleaning of deposits from the chamber.

It will be appreciated from the foregoing that the present invention represents a significant advance in the field of plasma processing. In particular, the invention provides a convenient technique for selecting a desirably lower dc bias for operating a plasma etch reactor while avoiding the need to limit rf power to the extent previously necessary, so that high etch rate and good selectivity are obtainable with less wafer damage and other negative effects. Use of the invention also reduces polymerization deposits and facilitates cleaning of polymerization deposits from the chamber. It will also be appreciated that, although the invention is described in the environment of a plasma etch reactor, it also applies to plasma processes other than etching, such as plasma-enhanced chemical vapor deposition. Other aspects and advantages of the invention will become apparent from the following more detailed description, taken together with the accompanying drawings.

DESCRIPTION OF THE PREFERRED EMBODIMENT

Figure 1:
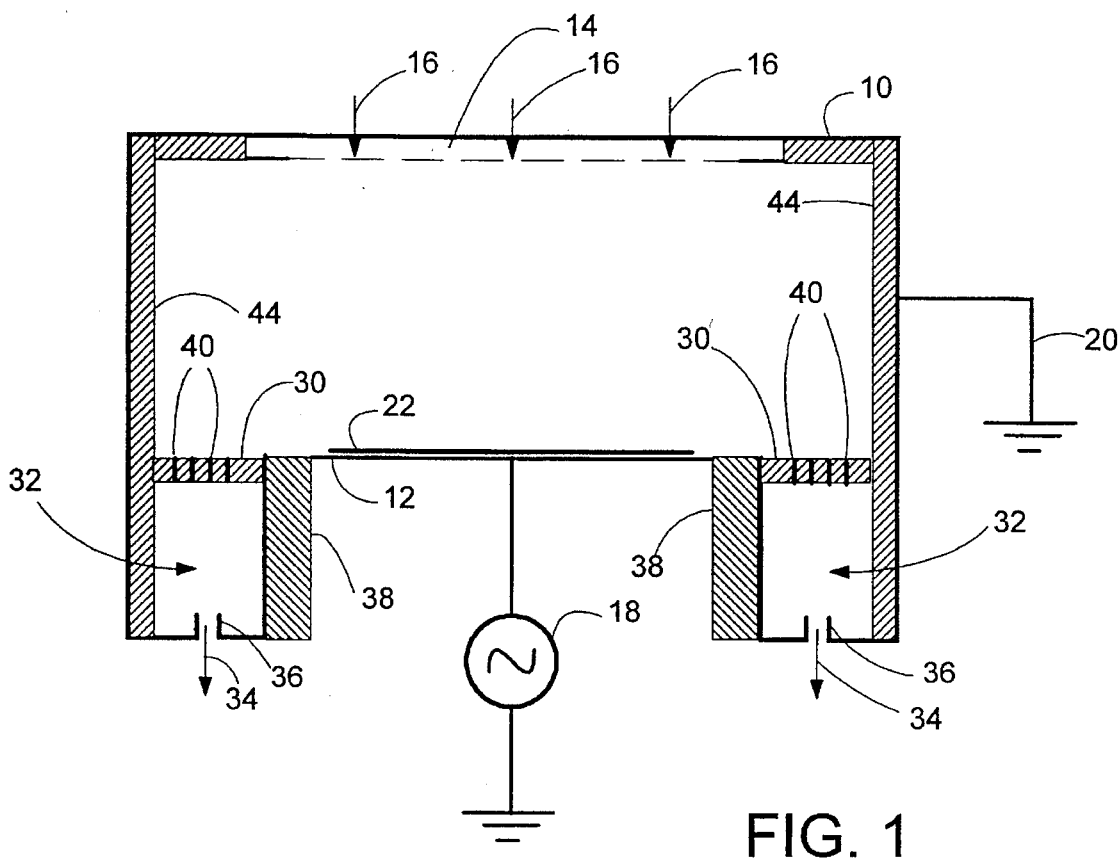
FIG. 1 is a diagrammatic view of a section through a plasma etch reactor depicting the principle of the invention.

As shown in the drawings for purposes of illustration, the present invention pertains to plasma reactors for use in the fabrication of semiconductor wafers. In conventional plasma generation techniques, a plasma is generated and maintained either by capacitive coupled, inductively coupled, or microwave coupled energy. By far the most common approach uses capacitive coupling of radio-frequency (rf) power through parallel-plate electrodes. A magnetic field may be used to enhance the density of the plasma. FIG. 1 depicts a vacuum reactor chamber 10, a lower electrode 12, referred to as the cathode, and an upper electrode 14, referred to as the anode, which typically also functions to introduce process gases into the chamber through openings in the electrode, as indicated by the arrows 16. Power is applied to the lower electrode 12, as indicated by an rf generator 18, one terminal of which is connected to the lower electrode and the other terminal of which is grounded. The upper electrode is typically connected to the walls of the chamber 10, which is grounded as indicated at 20. Since the upper electrode in this embodiment is electrically continuous with the chamber walls, as is typical, the upper electrode is also grounded.

When process gases are introduced as indicated at 16 and a suitable rf power is applied across the electrodes 12 and 14, a plasma of ions, electrons and other particles is generated and sustained in the chamber 10. Moreover, as is well known, the lower electrode 12 becomes negatively self-biased with respect to the plasma. This dc bias level is used to accelerate ions in the plasma into a semiconductor wafer 22 secured to the surface of the lower electrode 12 by a suitable clamp or an electrostatic chuck, neither of which is shown. The dc bias value increases with increasing rf power and is also approximately proportional to some power of the ratio of the anode area to the cathode area. Specifically, the proportionality to the area ratio may be expressed as:

$$V_{dc} \propto (A_a/A_c)^n,$$

where $V_{dc}$=the dc bias on the cathode 12, $A_a$=the area of the grounded area of the anode 14 and wall surface 10, $A_c$=the area of the cathode 12, and n=a constant.

The area of the anode, for this purpose, is the entire grounded area of the electrode 14 itself and the grounded walls of the chamber 10. Therefore, the dc bias on the cathode 12 may be relatively high, such as approximately 500 volts. The energy of the plasma and the ions used for etching the wafer 22 are, therefore, relatively high, which leads to wafer damage and related problems.

In accordance with the invention, two structural elements are added to the etch reactor chamber to reduce the effective area of the anode 14 and the grounded wall surface 10, and thereby to reduce the dc bias on the cathode 12. The first of these features is a plasma screen 30 that blocks the plasma from forming in part of the etch reactor chamber 10. In most etch reactor chambers of the type with which the invention is concerned, the cathode 12 is raised up into the chamber 10 and is isolated from the outer chamber walls by an annular region 32 of the chamber surrounding the cathode and extending down a substantial distance to the bottom of the chamber, where, as indicated by the arrows at 34, process gases are exhausted from the chamber through exhaust ports 36. There may also be a sleeve of insulating material 38 surrounding the cathode 12 and extending down to the bottom of the chamber 10. The plasma screen 30 includes a number of small slits 40 extending through the entire thickness of the screen and providing a path for process gases to be drawn down into the region 32 of the chamber 10 and out through the exhaust ports 34. However, the slits 40 are small enough to prevent the plasma from entering the region 32. To perform this function, the slits 40 must be narrower that the thickness of a sheath region of the plasma, sometimes referred to as the dark space. The specific width selected for the slits will depend on the power, the chamber pressure, the process gases used, and other factors. For example, in an etch chamber operated at 1,000 watts at a pressure of 250 mTorr, using as process gases Ar, $CHF_3$ and $CF_4$, the slits should preferably be approximately 20 mil (0.02 inch or 0.5 mm) or less in width. Preferably, the slits 40 have an arcuate length that is long relative to the slot width, as depicted in FIG. 2, and have an axial length, measured in the direction of gas flow, that is also long relative to the slot width, as depicted in FIG. 1.

Figure 2:
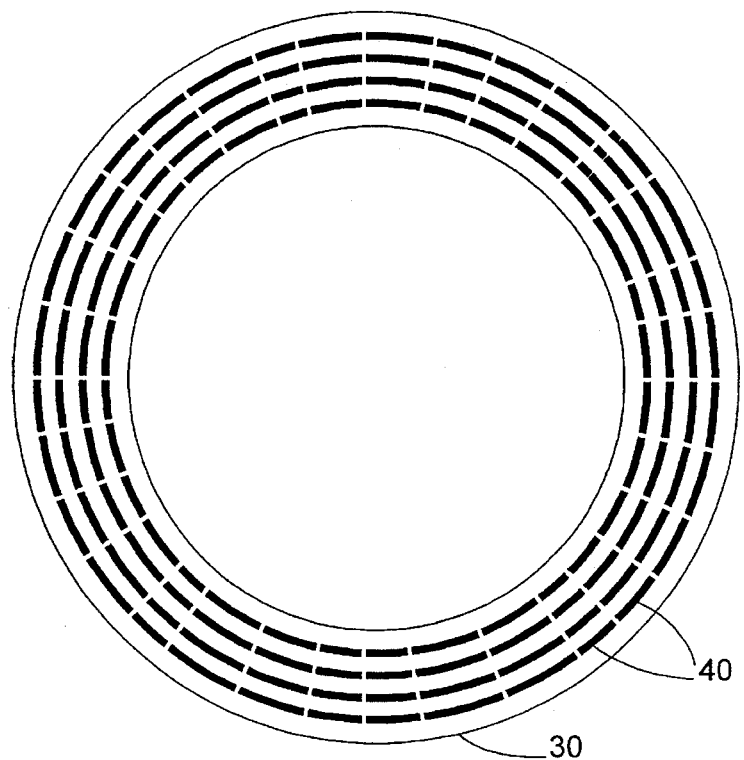
FIG. 2 is a diagrammatic plan view of plasma screen used in the plasma etch reactor of FIG. 1.

As shown in FIG. 2, the plasma screen 30 may be an annular element with arcuate slits 40 formed in it substantially as shown, but other forms of the screen may also be used. Instead of slits, circular holes may be used. Clearly, the number, size and spacing of the openings, whether they are slits or holes, may also have an effect on the pump rate at which gases are exhausted from the chamber 10 through the exhaust ports 36. If a large number of openings 40 are provided in the screen 30, pumps used prior to installation of the screen should still be able to provide adequate evacuation of the chamber 10.

The area of the anode 14 that affects the dc bias is the area with which the plasma is contact. Therefore, blocking the plasma from reaching the region 32 of the chamber significantly reduces the effective anode area and, therefore, the dc bias.

The other structural element employed to reduce the dc bias level is a chamber liner 44 of dielectric, i.e., insulating material. The chamber liner 44 shields a 15 large portion of the grounded chamber surface and thereby substantially reduces the ratio of the area of the anode 14 and the grounded wall surface 10 to the area of the cathode 12. The combined effects of the plasma screen 30 and the chamber liner 44 reduce the dc bias by as much as fifty percent. For example a reduction from −550 v to −300 v has been observed. Use of the liner 44 alone, without the plasma screen 30, is not nearly as effective, but provides 10–20% reduction in dc bias.

Selective installation of the plasma screen 30 and the chamber liner 44 provides a range of dc bias levels in the same chamber design. For example, installation of the plasma screen 30 but not the chamber liner 44 provides one level of dc bias reduction. Then the addition of the chamber liner 44, in whole or in part, reduces the dc bias further by a predetermined amount. Further control of the dc bias is provided by varying the selection of materials used for the chamber liner 44. Although preferably a dielectric material, the chamber liner may also be a semiconductor material, or even a conductor such as anodized aluminum. The material selection also determines, in part, the effective anode area and, therefore, the dc bias. The specific dc bias reductions obtained depend, of course, on the process operating parameters, including the rf power, the chamber pressure, the selection of process gases, the strength of any magnetic field applied for plasma enhancement, and so forth. Thus the same basic chamber design can be used to meet a variety of process requirements.

In addition to providing a selected lower dc bias rate and, therefore, less lattice damage in the wafer and other wafer processing advantages stemming from the lower dc bias, use of the invention also provides other significant advantages. Already mentioned is the increased flexibility of chamber configuration, enabling switching between high and low dc bias with only minor hardware changes to the basic chamber design. The ability to operate at a lower dc bias allows the use of higher powers and, therefore, higher etch rates, which means a higher processing throughput of wafers.

Another advantage, arising from use of the plasma screen 30, is that the effective chamber volume is reduced, from which it follows that plasma particle performance is improved. Because of the smaller chamber volume, the residence time of process gases in the chamber is reduced, and there will be less polymerization of the plasma. Polymerization of the plasma is an expected but undesirable by-product of plasma etching. Polymers formed in the plasma are deposited on the chamber walls and have to be cleaned off from time to time, usually by a wet (chemical) etching process. Wet etching has to be performed off-line, when plasma etching is suspended for maintenance, and is a significant source of inefficiency in plasma etch processing. The invention reduces this source of inefficiency in two ways.

First, because the plasma screen 30 reduces the effective chamber volume, and process gas residence time, the level of polymerization is reduced, so the polymers deposited on the chamber walls are easier to remove. Second, because the chamber walls now include a removable liner 44, maintenance time can be reduced by simply removing and replacing the liner. The removed liner can then be wet-cleaned while its replacement liner is still functioning in the etch chamber. Therefore, the time that the chamber vacuum pumps are turned off for maintenance is greatly reduced and the etch reactor can recover more quickly from interruptions for wet cleaning.

It will be appreciated from the foregoing that the present invention represents a significant advance in the field of plasma etching. In particular, the invention provides a simple yet highly effective technique for reducing dc bias in a plasma etch reactor to a predicted lower level than would be obtained without use of the invention. Thus, higher etch rates can be maintained without the wafer damage and other processing difficulties that ensue from use of a dc bias that is too high. As a result of lower dc bias, a lower $CHF_3/CF_4$ gas ratio might be used to achieve the same degree of oxide to polysilicon selectivity but at a leaner polymerization. This translates to less polymer deposition onto the wall and extends the utilization time of the chamber between interruptions of production for wet cleaning. Moreover, the invention can be used in a selective manner to change the dc bias characteristics of a plasma reactor chamber by making only minor hardware modifications. A further benefit of the invention is that the use of a chamber liner to reduce dc bias also simplifies, minimizes, and speeds up cleaning of the chamber to remove products of plasma polymerization. It will also be appreciated that, although a specific embodiment of the invention has been described in detail for purposes of illustration, various modifications may be made without departing from the spirit and scope of the invention. For example, it will be understood that, in some configurations, the electrical connections to ground and to an rf power supply will be reversed. It will be also be understood that the invention may be used in a variety of types of processing chambers, including conventional reactive ion etch (RIE) chambers in which power is capacitively coupled to the plasma, magnetically enhanced reactive ion etch (MERIE) chambers, RIE chambers in which plasma generation is enhanced by other means, such as inductively, and RIE chambers in which power is coupled to the plasma inductively or by microwave waveguides. Accordingly, the invention should not be limited except as by the appended claims.

We claim:

1. A plasma reactor with selectable direct current (dc) bias control, comprising:

a grounded reactor chamber having conductive walls;

a grounded first electrode located in the chamber;

a second electrode spaced apart from the first electrode, for supporting a workpiece to be processed in the reactor chamber;

at least one inlet port for supplying process gases to the reactor chamber;

at least one outlet port for evacuating gases from the chamber;

a high-frequency power source connected between the second electrode and ground, to generate and sustain a plasma in the reactor chamber; and a plasma shield installed in the reactor chamber to prevent the plasma from reaching a portion of the reactor chamber;

wherein the plasma shield has a plurality of narrow slits through it to permit the flow of process gases but not the plasma, the slits each having a cross-sectional area defined by a slit length dimension that is long relative to a slit width dimension, and the slits each having a length in the direction of gas flow that is also long relative to the slit width;

and wherein the effective area of the grounded first electrode is reduced because the plasma is prevented from contacting the full extent of the chamber walls, and the reduced effective area results in a reduced dc bias on the second electrode.

2. A plasma reactor as defined in claim 1, wherein:
the plasma shield is of a dielectric material.

3. A plasma reactor as defined in claim 2, wherein:
the openings are smaller in width than the thickness of a sheath region of the plasma.

4. A plasma reactor as defined in claim 3, wherein:
the openings are less than approximately 0.5 millimeter in width.

5. A plasma reactor as defined in claim 1, wherein:
the plasma shield includes an annular ring of dielectric material sized to fit in an annular region of the reactor chamber to prevent the plasma from reaching the annular region.

6. A plasma reactor as defined in claim 5, wherein:
the slits are smaller in width than the thickness of a sheath region of the plasma.

7. A plasma reactor as defined in claim 6, wherein:
the slits are less than approximately 0.5 millimeter in width.

8. A plasma reactor as defined in claim 1, and further comprising:
a removable chamber liner installed over at least a portion of the interior wall of the reactor chamber, to reduce the effective area of the first electrode and, therefore, the dc bias on the second electrode.

9. A plasma reactor as defined in claim 8, wherein:
the removable chamber liner is also of a dielectric material and extends over a selected portion of the interior wall of the reactor chamber, to effect a desired reduction in the dc bias.

10. A method of operation of a plasma reactor to reduce direct current (dc) bias, comprising the steps of:
installing a plasma shield in a plasma reactor chamber, the plasma shield having a plurality of slits through it, the slits each having a cross-sectional area defined by a width dimension and a length dimension that is long relative to the width dimension, and each further having an axial length that is also long relative to the width dimension, to permit passage of process gases but to prevent the passage of plasma to a selected portion of the reactor chamber;

supplying process gases to the chamber;

supplying high frequency power between a lower electrode and a grounded upper electrode in the chamber, to generate and sustain a plasma in the chamber; and pumping used process gases from the chamber;

wherein the presence of the plasma shield reduces the effective surface area of the grounded upper electrode and thereby reduces the dc bias between the lower electrode and the plasma.

11. A method as defined in claim 10, and further comprising the step of:
installing a removable chamber liner on at least a portion of the inside surface of the chamber, to further reduce the effective surface area of the grounded upper electrode and thereby further reduce the dc bias between the lower electrode and the plasma.

12. A method as defined in claim 11, and further comprising:
removing and replacing the removable chamber liner periodically to facilitate cleaning of deposits from the chamber.

13. A plasma substrate processor for use with a high frequency power supply, comprising:
a substrate support including a first electrode;
a vacuum enclosure containing said support and defining an evacuable substrate processing environment about said substrate support;
a process gas inlet provided in a wall of said enclosure;
a gas evacuation output provided in a wall of said enclosure;
a second electrode within said enclosure spaced from said first electrode, one of said electrodes being adapted to be connected to a high frequency power supply, the other being adapted to be connected to ground, so as to sustain a plasma within said enclosure based on the processing gases within said enclosure; and
a plasma shield overlaying a significant portion of the walls of said enclosure;
wherein any portion of the plasma shield which overlies one of said gas inlet and said gas evacuation outlet is provided with apertures small enough to prevent plasma from penetrating said apertures, yet large enough to allow passage of gas therethrough, each aperture having a cross-sectional area defined by a width dimension and a length dimension that is long relative to the width dimension, and each aperture having an axial length, measured in the direction of gas flow, that is also long relative the width dimension;
whereby the effective area of the chamber walls capable of contacting the plasma is reduced and self-bias on any substrate supported on the substrate support is reduced.

14. A plasma processor as in claim 13, in which a first portion of said plasma shield overlies a first region of the walls of said enclosure provided with at least one of said process gas inlet and said gas evacuation outlet, and said first shield portion has the apertures.

15. A plasma processor as in claim 14, in which said first shield portion is positioned between said first electrode and said first wall region.

16. A plasma processor as in claim 14, in which said first apertured shield portion surrounds said first electrode.

17. A plasma processor as in claim 16, in which said first apertured shield portion is positioned adjacent and generally in facing relationship to the enclosure wall supporting said substrate support.

18. A plasma processor as in claim 17, in which said first region of said enclosure wall comprises said enclosure wall supporting said substrate support.

19. A plasma processor as in claim 17, in which said first apertured shield portion is surrounded by and engages at an outer periphery thereof a second region of said enclosure wall.

20. A plasma processor as in claim 17, in which a solid second portion of said shield is provided over a second region of said enclosure walls which does not include said process gas inlet and gas evacuation outlet.

21. A plasma process as in claim 20, in which said shield is of a dielectric material.

* * * * *